United States Patent
Koike

(10) Patent No.: US 6,767,675 B2
(45) Date of Patent: Jul. 27, 2004

(54) MASK AND METHOD OF MANUFACTURING THE SAME

(75) Inventor: Tsutomu Koike, Hyogo (JP)

(73) Assignee: Renesas Technology Corp., Osaka (JP)

( * ) Notice: Subject to any disclaimer, the term of this patent is extended or adjusted under 35 U.S.C. 154(b) by 114 days.

(21) Appl. No.: 10/145,153

(22) Filed: May 15, 2002

(65) Prior Publication Data

US 2003/0096174 A1 May 22, 2003

(30) Foreign Application Priority Data

Nov. 19, 2001 (JP) ........................................ 2001-353222

(51) Int. Cl.⁷ .............................................. G03F 9/00
(52) U.S. Cl. ............................................ 430/5; 430/22
(58) Field of Search ...................................... 430/5, 22

(56) References Cited

U.S. PATENT DOCUMENTS 5,858,580 A * 1/1999 Wang et al. .................... 430/5

FOREIGN PATENT DOCUMENTS

| JP | 4-361521 | 12/1992 |
| JP | 2001-66757 | 3/2001 |
| TW | 426817 | 3/2001 |
| TW | 428 122 | 4/2001 |

* cited by examiner

Primary Examiner—Mark F. Huff
Assistant Examiner—Saleha Mohamedulla
(74) Attorney, Agent, or Firm—McDermott Will & Emery LLP

(57) ABSTRACT

A method of manufacturing a mask includes a mask preparation step of dividing a first desired mask pattern into a first mask pattern part and a second mask pattern part and performing rendering, development and etching on the first and second mask pattern parts independently of each other for preparing a first mask having the first mask pattern part and a second mask having the second mask pattern part independently of each other and a first superposition step of superposing the aforementioned first mask and the aforementioned second mask for combining the first mask pattern part and the second mask pattern part with each other so that the upper surfaces and the lower surfaces of the first and second mask pattern parts are flush with each other respectively thereby forming the aforementioned first desired mask pattern.

7 Claims, 4 Drawing Sheets

MASK AND METHOD OF MANUFACTURING THE SAME

BACKGROUND OF THE INVENTION

1. Field of the Invention

The present invention relates to a mask employed in a step of fabricating a semiconductor device or the like.

2. Description of the Prior Art

In general, a mask is employed for imparting a constant pattern onto a substrate in a step of fabricating a semiconductor device or the like. In order to manufacture this mask, a mask preparation system executes a mask preparation job. FIG. 8 shows the contents of a general mask preparation job. The system accepts mask pattern information and carries out a rendering step S1 on the basis of this information. Then, the system carries out a development step S2, an etching step S3 and an inspection step S4. A mask passing the inspection step S4 is regarded as a completed mask.

Following recent refinement and densification of the structure of a semiconductor device, a mask required therefor is also improved in precision and refined. Further, fabrication of mask patterns is complicated due to techniques such as shrink shrinking and fitting a pattern in a constant section at a constant magnification, optical proximity correction (OPC) correcting the thickness or the like in consideration of the difference between quantities of actually arriving light and the like. While a single mask pattern may include a generic part and a specific part or a part requiring high precision and a part requiring moderate precision, the rendering step disadvantageously requires excess time if the mask pattern is collectively prepared by the conventional mask preparation job.

SUMMARY OF THE INVENTION

An object of the present invention is to provide a method of manufacturing a mask capable of efficiently manufacturing a mask having a desired mask pattern.

In order to attain the aforementioned object, the method of manufacturing a mask according to the present invention comprises a mask preparation step of dividing a first desired mask pattern into a first mask pattern part and a second mask pattern part and performing rendering, development and etching on the first and second mask pattern parts independently of each other for preparing a first mask having the aforementioned first mask pattern part and a second mask having the second mask pattern part independently of each other and a first superposition step of superposing the aforementioned first mask and the aforementioned second mask for combining the aforementioned first mask pattern part and the aforementioned second mask pattern part with each other so that the upper surfaces and the lower surfaces of the aforementioned first and second mask pattern parts are flush with each other respectively thereby forming the aforementioned first desired mask pattern. According to this method, a desired mask pattern can be obtained by separately preparing masks in a divided manner in response to the difference between conditions of mask pattern parts included in the desired mask pattern and thereafter combining these masks with each other, whereby useful processing can be properly performed in response to the mask pattern parts for enabling efficient work.

In order to attain the aforementioned object, a mask according to the present invention comprises a first mask having a first mask pattern and a second mask having a second mask pattern prepared independently of each other, while the aforementioned first mask and the aforementioned second mask are superposed for combining the aforementioned first mask pattern part and the aforementioned second mask pattern part with each other so that the upper surfaces and the lower surfaces of the aforementioned first and second mask pattern parts are flush with each other respectively. According to this structure, the mask can be obtained by separately preparing the first and second mask patterns and combining the same with each other, whereby the mask can be efficiently manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

A mask and a method of manufacturing the same according to a first embodiment of the present invention are now described with reference to FIGS. 1 to 7.

Figure 1:
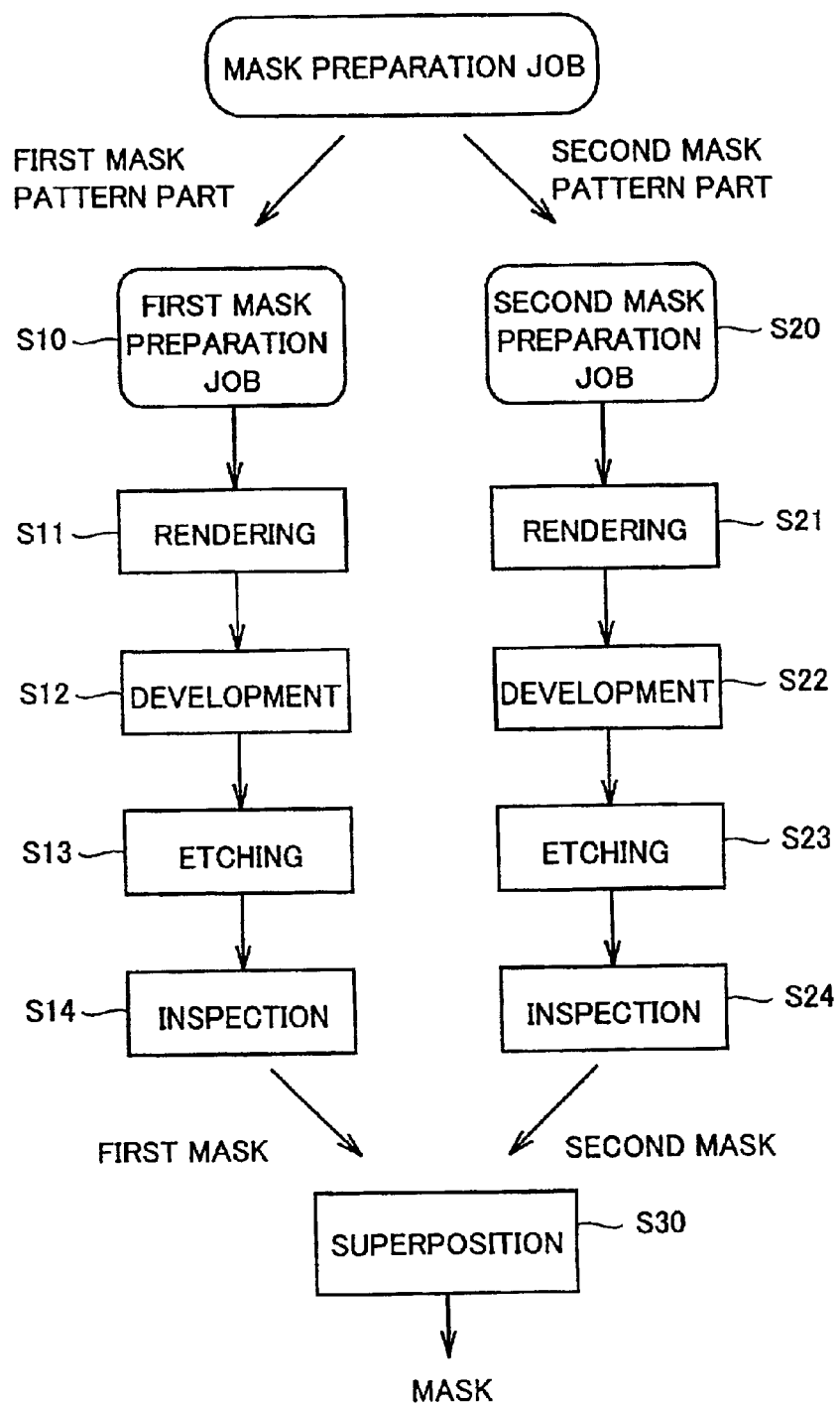
FIG. 1 is a flow chart of a method of manufacturing a mask according to a first embodiment of the present invention.

FIG. 1 is a flow chart of a mask preparation job according to the first embodiment. A desired mask pattern is first divided into a first mask pattern part and a second mask pattern part. This division is performed by completely cutting the desired mask pattern into two types of parts having no overlapping portions without omission as compared with the initial desired mask pattern. When the first and second mask pattern parts are combined with each other, therefore, the initial desired mask pattern can be obtained again.

Figure 2:
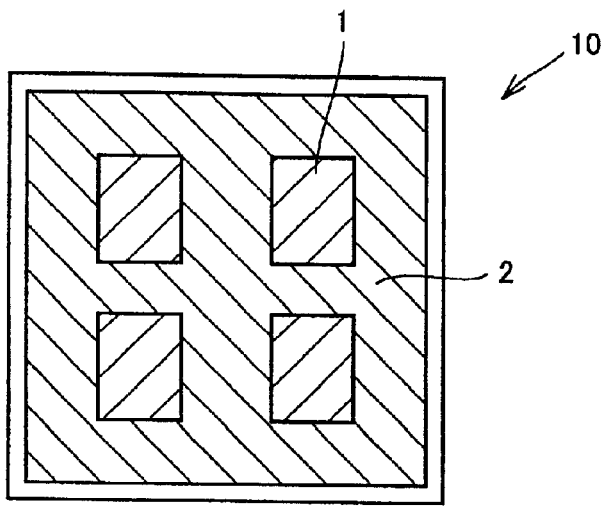
FIG. 2 is an explanatory diagram showing exemplary division of a mask pattern in the method of manufacturing a mask according to the first embodiment of the present invention.

In order to manufacture a mask 10 shown in FIG. 2, for example, this mask pattern is divided into first mask pattern parts 1 and a second mask pattern part 2, as shown in FIG. 2. While the inner areas of the mask pattern parts 1 and 2 are simply hatched in FIG. 2 for simplifying the illustration, various types of fine patterns are arranged on the hatched areas in practice.

The desired mask pattern is preferably divided into the mask pattern parts 1 and 2 in response to generic and specific portions included therein, for example. Alternatively, the desired mask pattern may be divided into mask pattern parts requiring high and low precision levels respectively or including fine and rough patterns respectively.

Figure 3:
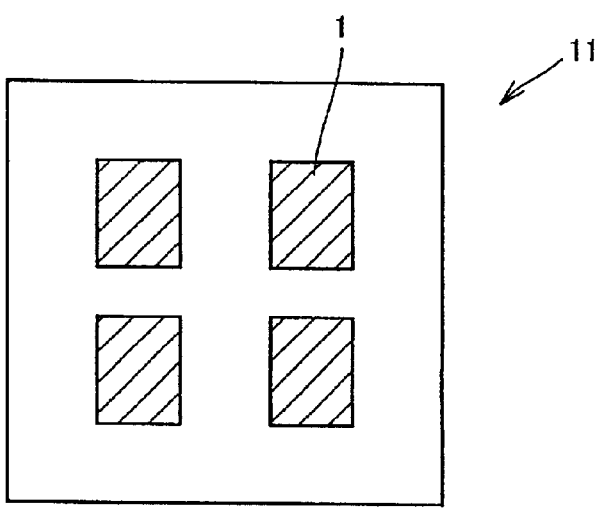
FIG. 3 is a plan view of a first mask prepared in the method of manufacturing a mask according to the first embodiment of the present invention.

In the mask preparation job for the method of manufacturing a mask according to this embodiment, the information of the desired mask pattern as divided is processed as different jobs, i.e., that including information of the first mask pattern parts 1 and information of the second mask pattern part 2 respectively. In a first mask preparation job S1 based on the information of the first mask pattern parts 1, a rendering step S11, a development step S12, an etching step S13 and an inspection step S14 are sequentially carried out only on the first mask pattern parts 1. Consequently, a first mask 11 having the first mask pattern parts 1 is obtained as shown in FIG. 3.

Figure 4:
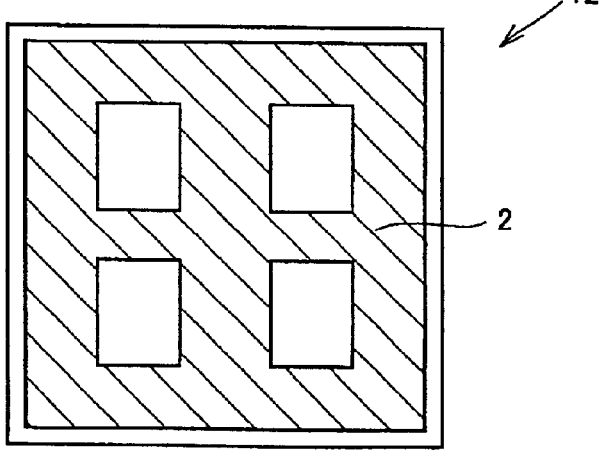
FIG. 4 is a plan view of a second mask prepared in the method of manufacturing a mask according to the first embodiment of the present invention.

In a second mask preparation job S20 based on the information of the second mask pattern part 2, a rendering step S21, a development step S22, an etching step S23 and an inspection step S24 are sequentially carried out only on the second mask pattern part 2. Consequently, a second mask 12 having the second mask pattern part 2 is obtained as shown in FIG. 4. Both of the first and second masks 11 and 12 are obtained by forming the mask pattern parts 1 and 2 on single sides of transparent substrates.

Figure 5:
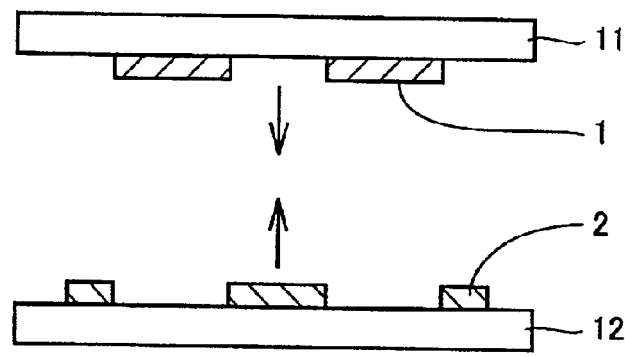
FIG. 5 is an explanatory diagram of a bonding step carried out in the method of manufacturing a mask according to the first embodiment of the present invention.
Figure 6:
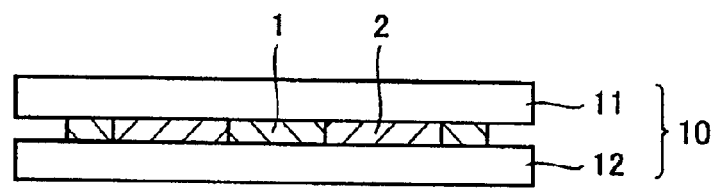
FIG. 6 is a sectional view showing an exemplary mask according to the first embodiment of the present invention.

Then, the first and second masks 11 and 12 are bonded to each other while directing the surfaces formed with the mask pattern parts 1 and 2 inward, as shown in FIG. 5. Consequently, the first and second mask pattern parts 1 and 2 are combined with each other so that the upper surfaces and the lower surfaces thereof are flush with each other respectively in the mask 10 manufactured by bonding the masks 11 and 12 to each other, as shown in FIG. 6. Thus, the first and second mask pattern parts 1 and 2 are combined without overlapping with each other while complementing void portions with each other.

Figure 7:
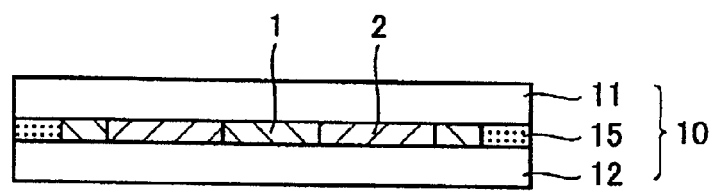
FIG. 7 is a sectional view showing another exemplary mask according to the first embodiment of the present invention.
Figure 8:
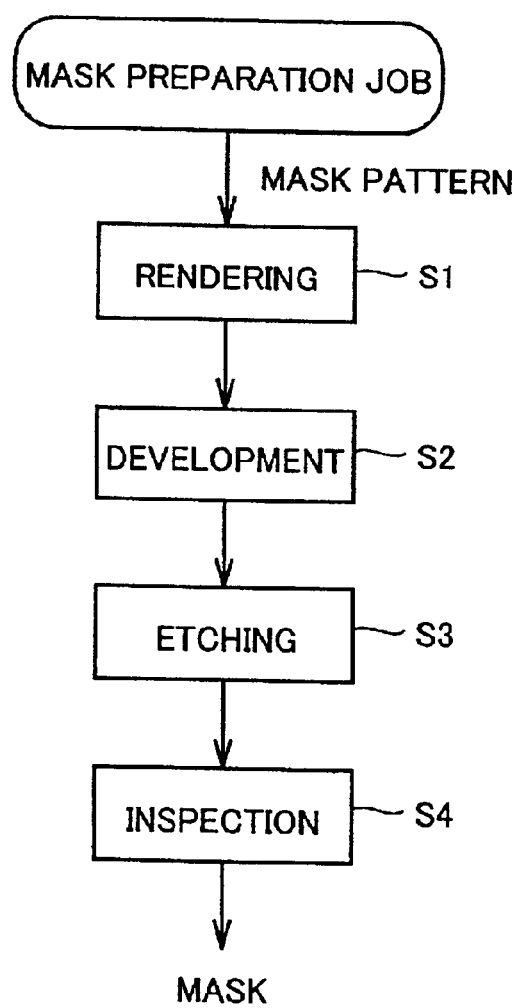
FIG. 8 is a flow chart of a conventional method of manufacturing a mask.

A transparent filler 15 may be charged between the first and second masks 11 and 12, as shown in FIG. 7.

In the method of manufacturing a mask according to this embodiment, a desired mask pattern is divided into two types of mask pattern parts subjected to processing such as rendering independently of each other, whereby the processing such as rendering can be performed on the mask pattern parts at precision levels responsive thereto when the mask pattern is divided in response to the required precision levels. Therefore, a part not requiring high precision can be quickly processed at a necessary precision level with no waste of time, while a part requiring high precision can be processed at a high precision level required thereto.

When the desired mask pattern is divided into parts including fine and rough patterns respectively, the technique such as shrink or OPC can be applied to the fine mask pattern part, which is subjected to rendering etc. independently of the rough mask pattern part. This technique is applied not to the overall initial desired mask pattern but only to the necessary mask pattern part, thereby enabling efficient work.

When the filler 15 is charged between the first and second masks 11 and 12 bonded to each other to define no clearance as shown in FIG. 7, formation of an undesired clearance or a problem of light refractivity can be avoided. The filler 15, desirably transparent, can be prepared from a liquid such as silicon rubber, for example.

(Second Embodiment)

A method of manufacturing a mask according to a second embodiment of the present invention is now described. This method employs two types of desired mask patterns referred to as a first desired mask pattern and a second desired mask pattern respectively. The first desired mask pattern is divided into a first mask pattern part specific to the first desired mask pattern and a second mask pattern part sharable with the second desired mask pattern, for manufacturing a mask according to the method described with reference to the first embodiment. Thus, a mask comprising the first desired mask pattern is obtained. At this time, another mask comprising the second mask pattern part, i.e., a second mask is prepared extra.

A portion of the second desired mask pattern not implementable by the second mask pattern part is employed as a third mask pattern part for executing a mask preparation job and preparing still another mask comprising a third mask pattern part, i.e., a third mask. A mask comprising the second desired mask pattern can be obtained by combining the extra second mask prepared in advance with the newly prepared third mask.

When a plurality of desired mask patterns are required in response to the types of devices, a mask for a generic part can be continuously prepared while fixing a job or prepared in advance by dividing the desired mask patterns into the generic part common to the devices and specific parts having details for the respective devices. When the mask for the generic part such as the second mask in the second embodiment is combined with a specific mask such as the third mask in the second embodiment prepared at need, a desired mask can be obtained so that production efficiency can be improved also when the method is directed to a plurality of types of mask patterns.

While the second embodiment has been described with reference to two types of desired mask patterns, the aforementioned method according to the second embodiment is also applicable to a larger number of types of mask patterns by extracting a common part from these mask patterns, for example. The present invention can remarkably contribute to improvement of production efficiency for a larger number of types of mask patterns by preparing masks independently of each other while employing the common part as a generic part.

According to the present invention, a desired mask pattern is divided into masks in response to precision levels or general-purpose properties so that the desired mask pattern can be obtained by thereafter combining the masks with each other, whereby useful processing can be properly performed in response to the mask pattern parts for enabling efficient work.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a mask comprising:
   a mask preparation step of dividing a first desired mask pattern into a first mask pattern part and a second mask pattern part and performing rendering, development and etching on said first and second mask pattern parts independently of each other for preparing a first mask having said first mask pattern part and a second mask having said second mask pattern part independently of each other; and
   a first superposition step of superposing said first mask and said second mask for combining said first mask pattern part and said second mask pattern part with each other so that the upper surfaces and the lower surfaces of said first and second mask pattern parts are flush with each other respectively thereby forming said first desired mask pattern.

2. The method of manufacturing a mask according to claim 1, wherein said first mask pattern part requires a first precision level, and said second mask pattern part requires a second precision level lower than said first precision level.

3. The method of manufacturing a mask according to claim 1, wherein said first mask pattern part is specific to this mask, and said second mask pattern part is generic.

4. The method of manufacturing a mask according to claim 1, further including, in order to obtain a second desired mask pattern including the same mask pattern as said second mask pattern part:

a third mask pattern preparation step of further separately performing rendering, development and etching for preparing a third mask having a third mask pattern part, and a second superposition step of superposing said second mask and said third mask for combining said second mask pattern part and said third mask pattern part with each other so that the upper surfaces and the lower surfaces of said second and third mask pattern parts are flush with each other respectively thereby forming said second desired mask pattern.

5. The method of manufacturing a mask according to claim 1, charging a filler between said first mask and said second mask to define no clearance in said first superposition step.

6. A mask comprising a first mask having a first mask pattern and a second mask having a second mask pattern prepared independently of each other, wherein said first mask and said second mask are superposed for combining said first mask pattern part and said second mask pattern part with each other so that the upper surfaces and the lower surfaces of said first and second mask pattern parts are flush with each other respectively.

7. The mask according to claim 6, wherein a filler is charged between said first mask and said second mask.

* * * * *

UNITED STATES PATENT AND TRADEMARK OFFICE
CERTIFICATE OF CORRECTION

PATENT NO. : 6,767,675 B2
DATED : July 27, 2004
INVENTOR(S) : Tsutomu Koike

It is certified that error appears in the above-identified patent and that said Letters Patent is hereby corrected as shown below:

Title page,
Item [73], Assignee, change "OSAKA" to -- TOKYO --

Signed and Sealed this

Thirtieth Day of November, 2004

JON W. DUDAS
*Director of the United States Patent and Trademark Office*

UNITED STATES PATENT AND TRADEMARK OFFICE
CERTIFICATE OF CORRECTION

PATENT NO. : 6,767,675 B2
DATED : July 27, 2004
INVENTOR(S) : Tsutomu Koike

It is certified that error appears in the above-identified patent and that said Letters Patent is hereby corrected as shown below:

<u>Title page,</u>
Item [73], Assignee, change "OSAKA" to -- TOKYO --

Signed and Sealed this

Twenty-first Day of December, 2004

JON W. DUDAS
*Director of the United States Patent and Trademark Office*